(12) United States Patent
Wang et al.

(10) Patent No.: US 10,627,694 B1
(45) Date of Patent: Apr. 21, 2020

(54) HYBRID DISPLAYS INCLUDING ELECTROPHORETIC DISPLAYS AND LIGHT EMITTING DIODES

(71) Applicant: Amazon Technologies, Inc., Seattle, WA (US)

(72) Inventors: Ming Wang, Fremont, CA (US); Weihsin Hou, Fremont, CA (US); Robert Arthur Sprague, Saratoga, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/671,500

(22) Filed: Aug. 8, 2017

(51) Int. Cl.
| | | |
|---|---|---|
| *H01L 27/32* | (2006.01) | |
| *G02F 1/167* | (2019.01) | |
| *G02F 1/155* | (2006.01) | |
| *G09G 3/20* | (2006.01) | |
| *H01L 51/50* | (2006.01) | |
| *G09G 3/34* | (2006.01) | |

(52) U.S. Cl.
CPC ............ *G02F 1/167* (2013.01); *G02F 1/155* (2013.01); *G09G 3/2092* (2013.01); *G09G 3/344* (2013.01); *H01L 27/32* (2013.01); *H01L 27/3211* (2013.01); *H01L 27/3213* (2013.01); *H01L 27/3225* (2013.01); *H01L 27/3267* (2013.01); *H01L 51/50* (2013.01); *G09G 2300/0439* (2013.01); *G09G 2380/14* (2013.01); *H01L 27/322* (2013.01)

(58) Field of Classification Search
None
See application file for complete search history.

(56) References Cited

U.S. PATENT DOCUMENTS

| | | | |
|---|---|---|---|
| 2006/0187155 A1* | 8/2006 | Chang ................. | G09G 3/3208 345/76 |
| 2011/0080417 A1* | 4/2011 | Lin ........................ | G09G 3/344 345/522 |
| 2011/0115769 A1* | 5/2011 | Hsieh ................... | G09G 3/3233 345/211 |

(Continued)

OTHER PUBLICATIONS

"Nemoptic OLED/BiNem Combo Display Gets Video Demo", Chris Davies (https://www.slashgear.com/author/chris/) Oct. 11, 2010. (Year: 2010).*

(Continued)

*Primary Examiner* — Brian M Butcher
(74) *Attorney, Agent, or Firm* — Eversheds Sutherland (US) LLP

(57) ABSTRACT

Systems, methods, and computer-readable media are disclosed for hybrid displays including electrophoretic displays and organic light emitting diodes. In one embodiment, an example display may include an alternating array with OLED units and EPD units disposed on a substrate, a structural layer defining walls separating each of the EPD units, and a color filter array substrate disposed on a side of the display opposite the substrate. The OLED units may include red OLED units, green OLED units, and blue OLED units, and the color filter array may include red filters, green filters, and blue filters that align with the EPD segments that are adjacent to the red OLED units, the green OLED units, and the blue OLED units, respectively.

20 Claims, 10 Drawing Sheets

(56) References Cited

U.S. PATENT DOCUMENTS

| | | | | |
|---|---|---|---|---|
| 2015/0029418 | A1* | 1/2015 | Ueda | G02F 1/167 349/12 |
| 2015/0228217 | A1* | 8/2015 | Perdices-Gonzalez | G09G 3/348 345/5 |
| 2016/0005353 | A1* | 1/2016 | Bennett | G09G 3/3208 345/206 |
| 2017/0301288 | A1* | 10/2017 | Perdices-Gonzalez | G09G 3/3225 |
| 2017/0309215 | A1* | 10/2017 | Perdices-Gonzalez | G09G 3/2092 |
| 2017/0310940 | A1* | 10/2017 | Perdices-Gonzalez | G09G 3/2092 |
| 2017/0310956 | A1* | 10/2017 | Perdices-Gonzalez | H04N 13/366 |
| 2018/0059499 | A1* | 3/2018 | Klement | G09G 3/3413 |

OTHER PUBLICATIONS

"A Concept Phone That Uses an E Ink/OLED double display", Ron Mertens (https://www.e-ink-info.com/conept-phone-uses-e-ink-double-display) Nov. 18, 2010. (Year: 2010).*

"Energy Efficient Hybrid Display for Embedded and Mobile Systems", Yuanfeng Wen, Aug. 2013. (Year: 2013).*

"Apple's Wide Color Screen on the iPhone 7 Will Lead to More Faithful Color Reproduction", Mike Wuerthele, Sep. 2016. (Year: 2016).*

"Here's How Much the New iPhone 7 Costs and When You Can Get It", Antonio Villas-Boas, Sep. 2016. (Year: 2016).*

\* cited by examiner

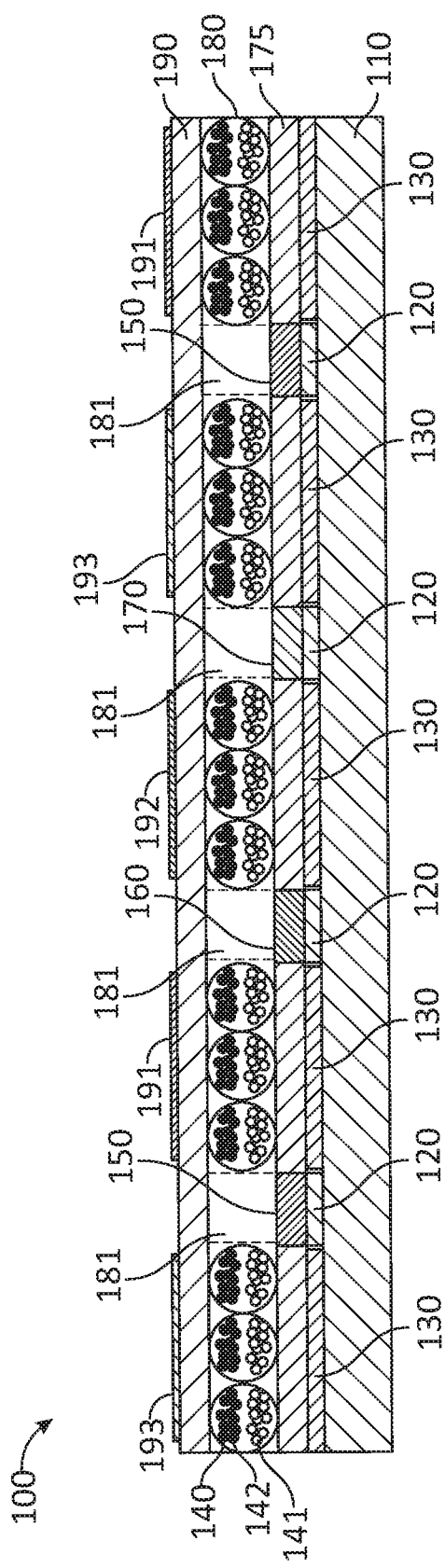
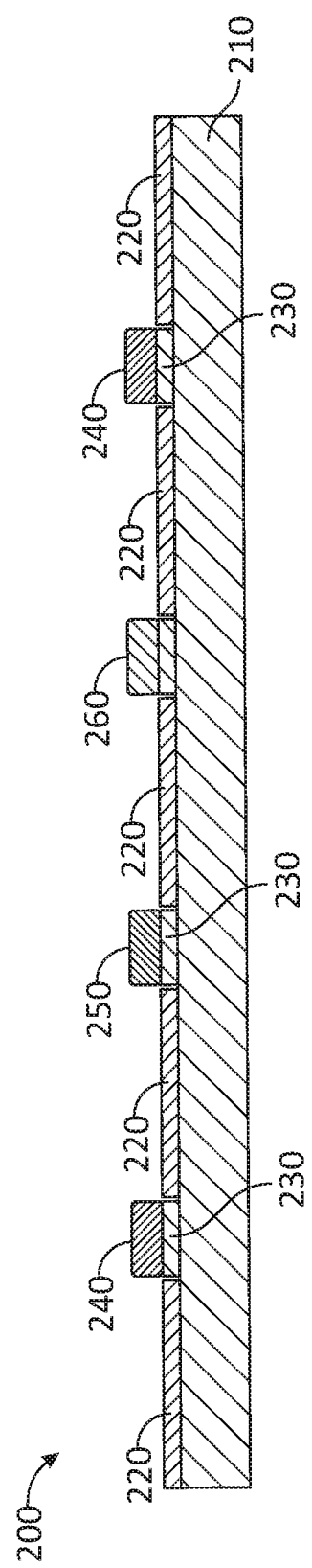
FIG. 1
FIG. 2A

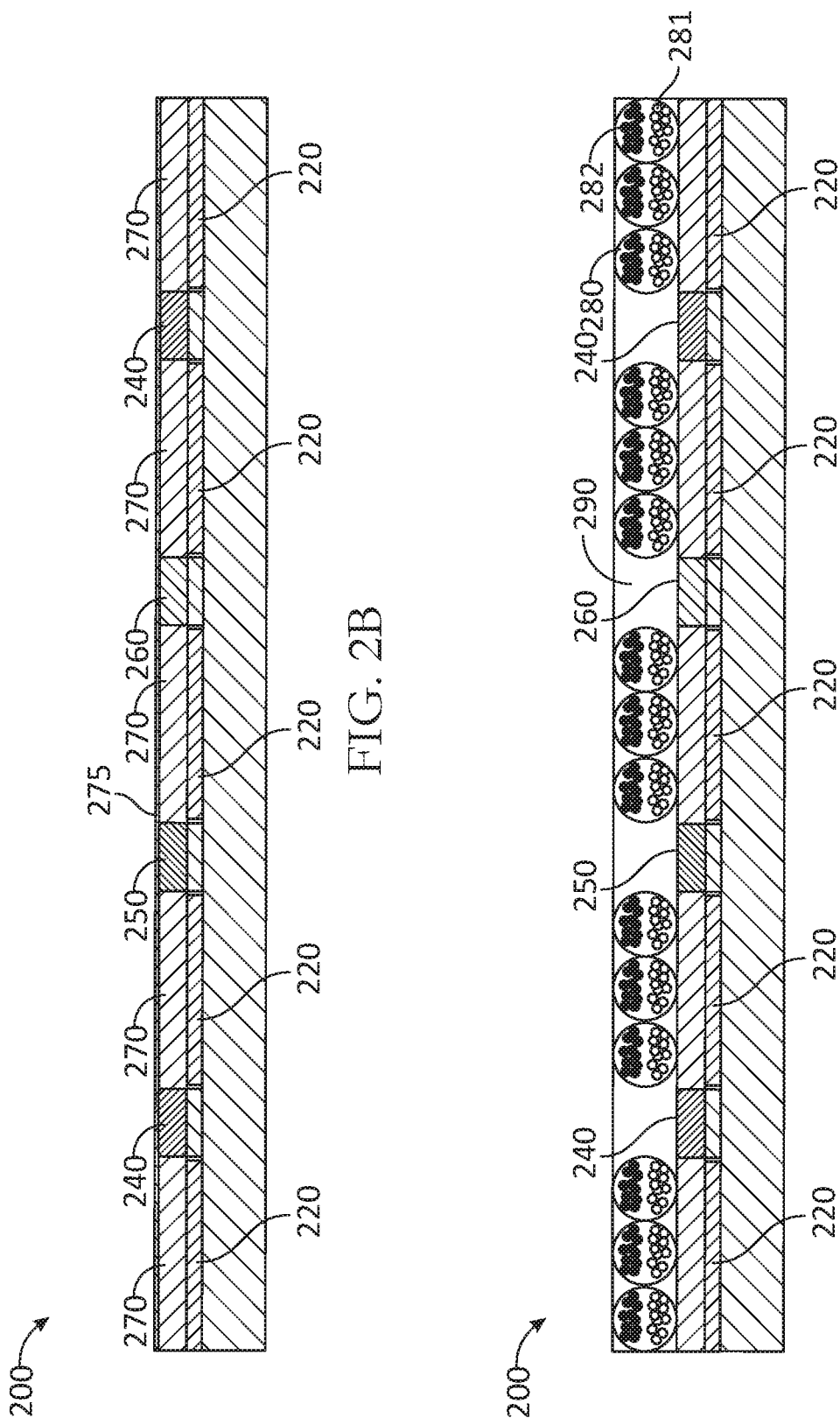

Red

Green

HYBRID DISPLAYS INCLUDING ELECTROPHORETIC DISPLAYS AND LIGHT EMITTING DIODES

BACKGROUND

Electronic devices may include light emitting diodes (LEDs) used to illuminate displays. Some devices may be configured to use emissive displays, while other displays may be reflective. Different types of displays may perform differently in different environments and ambient lighting conditions. As a result, a display type may impact a user experience and/or viewability of content on an electronic device. Emissive displays may have certain attributes that are more desirable than reflective displays, while reflective displays may have certain attributes that are more desirable than emissive displays. Hybrid displays that incorporate various aspects of different display types may therefore provide increased viewability and functionality, and an improved user experience.

BRIEF DESCRIPTION OF THE DRAWINGS

FIG. 1 depicts a cross-sectional side view of one embodiment of a display that includes an embodiment of electrophoretic display (EPD) microcapsules in accordance with one or more embodiments of the disclosure.

FIG. 2A depicts a cross-sectional side view of one embodiment of a substrate unit including an embodiment of an array of organic light emitting diode (OLED) segments and electrodes in accordance with one or more embodiments of the disclosure.

FIG. 2B depicts a cross-sectional side view of the embodiment of the substrate unit of FIG. 2A onto which an embodiment of a layer including hydrophobic and hydrophilic segments has been disposed in accordance with one or more embodiments of the disclosure.

FIG. 2C depicts a cross-sectional side view of one embodiment of a substrate unit onto which an embodiment of a slurry including EPD microcapsules has been disposed in accordance with one or more embodiments of the disclosure.

Figure 2D:
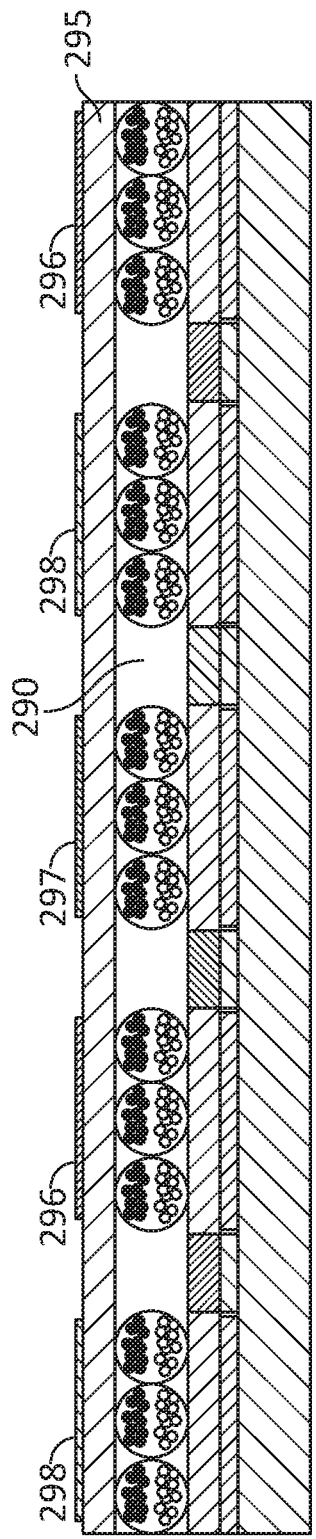
FIG. 2D depicts a cross-sectional side view of an embodiment of a display that includes an embodiment of EPD microcapsules in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Electronic displays are found in electronic devices such as electronic book readers ("e-book readers"), cellular telephones, personal digital assistants (PDAs), portable media players, tablet computers, netbooks, desktop computers, televisions, and so on. The electronic displays of these devices present information, operational status, and content items such as books and movies to viewers.

Some electronic displays may be either emissive or reflective. Some reflective displays, such as electrophoretic displays (EPDs), provide a visual experience similar to "pigment-on-paper." These are termed "reflective" because they operate predominately by changing their reflectance to light falling on their surface. Reflective displays typically require very little or no power after formation of an image, making them useful in mobile applications, such as e-book readers and the like, where battery power is limited. Reflective displays also provide good visibility in bright conditions, such as sunlight. Unfortunately, reflective displays typically have slow refresh rates, require special front or side-lighting to remain usable in dark conditions and, in some instances, do not render color.

In contrast to reflective displays, emissive displays, such as organic light emitting diodes (OLEDs), produce their own light. Emissive displays may enable faster refresh rates and color output, although emissive displays may wash-out and become less visible in bright light such as sunlight.

Electronic devices may be used to consume digital content. Some electronic devices may be configured to display or present digital content on a display device, such as a frontlit display device. A variety of devices, such as electronic book or e-reader devices, desktop computers, portable computers, smartphones, tablet computers, televisions, wearable devices, and so forth may be used to access various forms of content and other information. Embodiments of the disclosure may include hybrid displays that include OLED and EPD technology. Certain embodiments may include hybrid displays that rely on reflective and emissive technology to accommodate different lighting conditions, include those experienced indoors and outdoors. As a result, improved viewability may be achieved in a number of environments having different lighting, including indoor and outdoor environments. While described in the context of OLEDs, embodiments of the disclosure may include other light emitting diodes, such as micro-LEDs, LEDs, and other diodes.

This disclosure relates to, among other things, displays, methods, devices, computer-readable media, techniques, and methodologies for hybrid displays that include emissive and reflective technologies. Embodiments of the displays include OLED units and EPD units, which may permit the use of one or more driving schemes to improve viewability in a number of environments. Certain embodiments of the displays include OLED units and EPD units disposed on the same substrate.

Figure 6:
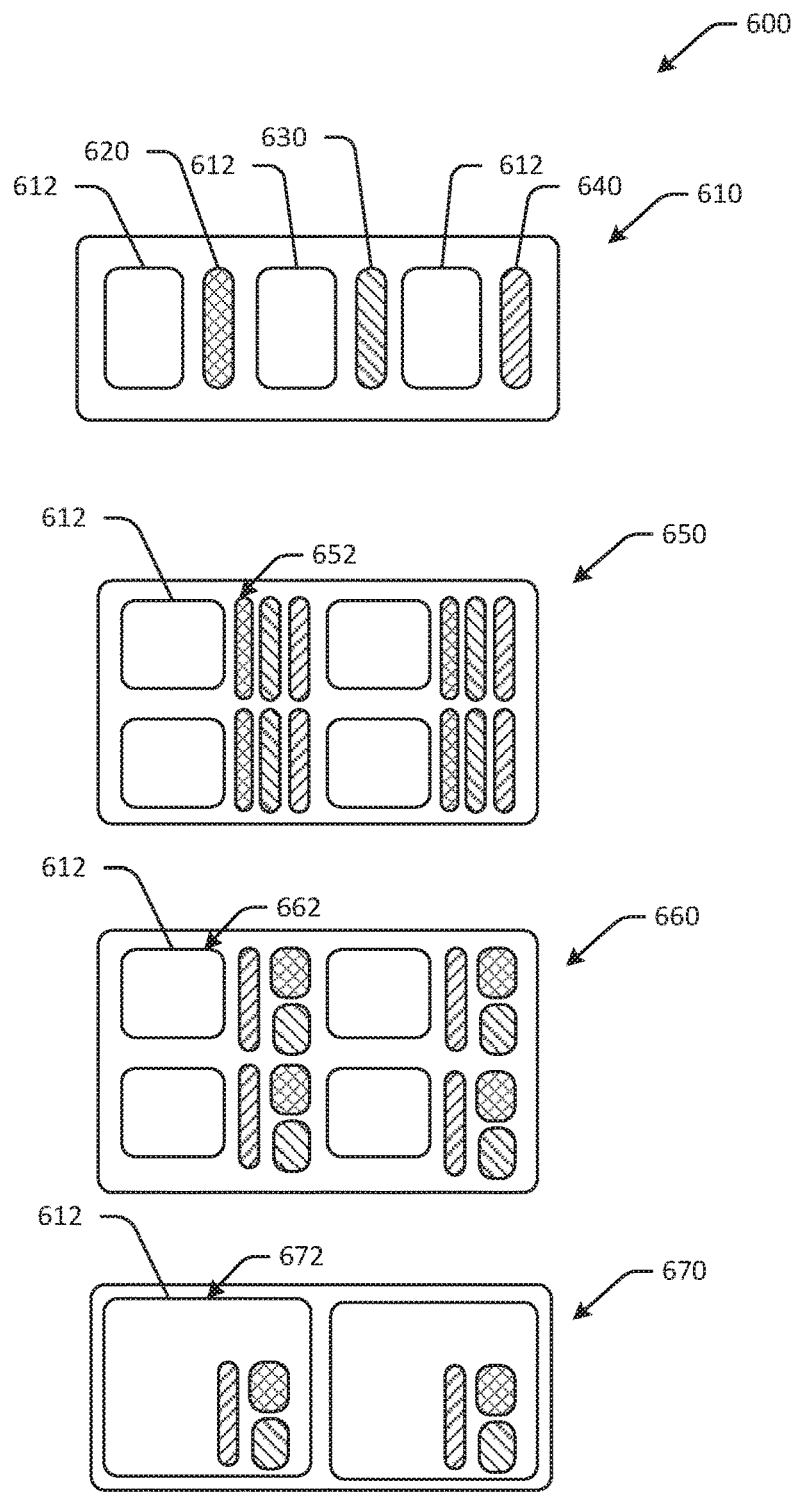
FIG. 6 is a schematic drawing of an example pixel designs in top views in accordance with one or more embodiments of the disclosure.

Referring to FIG. 1, a display 100 is depicted that includes OLED and EPD units disposed on the same substrate. FIG. 1 depicts a cross-sectional side view of one embodiment of a display 100. The display 100 includes a substrate 110, and disposed on the substrate 110 are OLED electrodes 120 and electrodes 130. Disposed on the OLED electrodes 120 are a red OLED segment 150, a green OLED segment 160, and a blue OLED segment 170. Arranged between the OLED segments (150, 160, 170) is an inert material 175 having a hydrophilic surface, which may be provide by a separate hydrophilic layer. The hydrophilic surface of the inert material 175 may assist the manufacturing of the display 100. EPD microcapsules 140 are arranged over each of the electrodes 130. Each EPD microcapsule 140 includes a white pigment 141 and a black pigment 142. The display also includes a structural layer 180 that defines partitioning walls 181 between the portions of EPD microcapsules 140. Disposed on the structural layer 180 is a color filter array substrate 190, and disposed on the color filter array substrate 190 is a color filter array that includes a red filter 191, a green filter 192, and a blue filter 193. In some embodiments, OLED segments may include full pixels, and one or more OLED segments may include multiple subpixels of various colors. For example, in some embodiments, an OLED segment may include one or more red subpixels, one or more green subpixels, and one or more blue subpixels. Other embodiments may include OLED segments with additional or fewer subpixels and/or subpixel colors. Example pixel designs are illustrated in FIG. 6.

As a result, performance or functionality of the display and/or device may be improved, at least in part, by subjecting the display to a driving scheme that utilizes the OLED units and EPD units, together or separately, to improve viewability in environments of different lighting.

Example embodiments of the disclosure provide a number of technical features or technical effects. For example, in accordance with example embodiments of the disclosure, certain embodiments of the disclosure may include hybrid OLED and EPD displays that improve color and contrast in indoor environments, improve lighting and viewability of displays, and improve functionality for users of a device. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

FIG. 2A-2D depict cross-sectional side views of an embodiment of a display, such as the display depicted at FIG. 1, at various stages of assembly according to one embodiment of a method of manufacturing a display. As depicted at FIG. 2A, a substrate unit 200 is provided that includes a substrate 210 onto which an embodiment of an alternating array of electrodes has been disposed. The alternating array of electrodes includes a plurality of electrodes 220 and a plurality of OLED electrodes 230. Each of the plurality of electrodes 220 is arranged between two of the plurality of OLED electrodes 230. Other electrode array configurations are possible, however, and may be employed in the displays and methods provided herein. The substrate unit 200 also includes a plurality of OLED segments that includes red OLED segments 240, green OLED segments 250, and blue OLED segments 260. The plurality of OLED segments (240, 250, 260) is disposed on the plurality of OLED electrodes 230.

The substrate unit 200 of FIG. 2A generally may be assembled by any known techniques. The substrate unit 200 may provide an active matrix for controlling the pixels of a display. A passive matrix also may be used in certain embodiments.

As depicted at FIG. 2B, a first structural material 270 may be applied to the substrate unit 200 of FIG. 2A. The first structural material 270 is disposed on the plurality of electrodes 220. The first structural material 270 generally may be any material that does not substantially undermine or undesirably impact the performance of a resulting display. The first structural material 270 may be applied by any known technique. The top surface of the first structural material 270 (e.g., the surface opposite the substrate) of FIG. 2B substantially aligns with the top surfaces of the OLED segments (240, 250, 260) (e.g., the surface opposite the substrate). The alignment of these surfaces may ease one or more steps of the manufacturing processes provided herein, but other configurations are possible. For example, the top surface of the first structural material may not align with the top surfaces of the OLED segments. The distance between the top surface of the first structural material and the substrate surface may exceed the distance between the top surface of the OLED segments and the substrate surface; or, the distance between the top surface of the first structural material and the substrate surface may be less than the distance between the top surface of the OLED segments and the substrate surface. As a further example, the distance between the top surface of the first structural material and the substrate surface may exceed the distance between the top surface of the OLED segments and the substrate surface for a first portion of the first structural material, and the distance between the top surface of the first structural material and the substrate surface may be less than the distance between the top surface of the OLED segments and the substrate surface for a second portion of the first structural material.

As depicted at FIG. 2B, a hydrophobic/hydrophilic layer 275 is applied to the substrate unit 200. The hydrophobic/hydrophilic layer 275 includes an alternating series of hydrophobic segments and hydrophilic segments. The hydrophobic segments are arranged on the OLED segments (240, 250, 260), and the hydrophilic segments are arranged on the first structural material 270. The hydrophobic segments may have dimensions that substantially correspond to the dimensions of each of the OLED segments (240, 250, 260), or the hydrophobic segments may have dimensions that exceed or are less than the dimensions of each of the OLED segments (240, 250, 260) in at least one aspect, e.g., length or width.

As depicted at FIG. 2C, a plurality of EPD microcapsules 280 may be applied to the substrate unit 200. The plurality of EPD microcapsules 280 includes a white pigment 281 and a black pigment 282. The plurality of EPD microcapsules 280 is applied to the substrate unit 200 of FIG. 2C as a slurry that includes the plurality of EPD microcapsules 280 and a second structural material 290. The second structural material 290 generally may be any material that is (i) capable of forming a slurry with the plurality of EPD microcapsules 280 that may be applied to the substrate unit 200, and (ii) transparent. The second structural material 290 must be transparent in the embodiment depicted at FIG. 2C in order to permit the passage of light emitted by the OLED segments (240, 250, 260).

The plurality of EPD microcapsules 280 of the embodiment depicted at FIG. 2C generally have a structure and/or other feature that facilitates or promotes the attraction of the plurality of EPD microcapsules 280 to the hydrophilic segments of the hydrophobic/hydrophilic layer 275. For example, the plurality of EPD microcapsules 280 may have a chemical structure that includes one or more hydrophilic moieties. Additionally or alternatively, the attraction or repulsion between the plurality of EPD microcapsules 280 and the hydrophobic/hydrophilic layer 275 may be facilitated and/or assisted by other forces, such as electrostatic forces, van der Walls forces, ionic forces, etc.

In the embodiment depicted at FIG. 2B, the hydrophobic and hydrophilic segments may ensure, at least in part, that EPD microcapsules applied to the substrate unit 281 are arranged at one or more desired locations. For example, the plurality of EPD microcapsules 280 of the embodiment depicted at FIG. 2C have a structure and/or other feature that attracts the plurality of EPD microcapsules 280 to the hydrophilic segments of the hydrophobic/hydrophilic layer 275. As a result, the plurality of EPD microcapsules 280 are arranged at the hydrophilic segments of the hydrophobic/hydrophilic layer 275, which align with the electrodes 220. The plurality of EPD microcapsules 280 may be repelled by the hydrophobic segments of the hydrophobic/hydrophilic layer 275, thereby providing a microcapsule-free path in the second structural material 290 through which light emitted from the plurality of OLED segments (240, 250, 260) may pass.

The dimensions of the microcapsule-free path in the second structural material 290 may be tailored by adjusting the dimensions of the hydrophilic segments and/or the hydrophobic segments of the hydrophilic/hydrophobic layer 275. For example, the hydrophobic segments may have dimensions that exceed the dimensions of the OLED segments (240, 250, 260) in at least one aspect, thereby providing a relatively larger microcapsule-free path through the second structural material 290.

Due to the interaction between the plurality of EPD microcapsules 280 and the hydrophobic/hydrophilic layer 275, the plurality of EPD microcapsules 280 may self-align with the electrodes 220. The slurry including the plurality of EPD microcapsules 280 and the second structural material 290 may be treated, before or after its application to the substrate unit 200, to facilitate or increase the hydrophilic/hydrophobic nature of the EPD microcapsules. The treatment may include a chemical treatment (e.g., a treatment that introduces or increases a charge) or another treatment, such as applying a voltage to the slurry and/or the substrate unit 200. In some embodiments, hydrophobic or hydrophilic coatings may not be included. Instead, a positive voltage may be applied to the EPD electrodes during deposition of the microcapsules. The microcapsules may include a material in the slurry that causes the microcapsules to self-align with the EPD electrodes due to the voltage. In such embodiments, excess microcapsules may be washed away and the unit may be dried and baked, leaving behind microcapsules with the correct alignment and without the need for using hydrophobic or hydrophilic layers. For example, if gelatin microcapsules are used, the gelatin microcapsules may be transformed and aligned during the dry and/or bake process.

In the embodiment depicted at FIG. 2D, a color filter array substrate 295 is applied to the second structural material 290. The color filter array substrate 295 hosts a color filter array that includes red filters 296, green filters 297, and blue filters 298. The color filter array may be disposed on the color filter array substrate before or after the color filter array substrate 295 is disposed on the second structural material 290.

Embodiments of the method depicted at FIG. 2A-2D also may include disposing a cover lens on the display, including touch screen capability, or a combination thereof.

Figure 3:
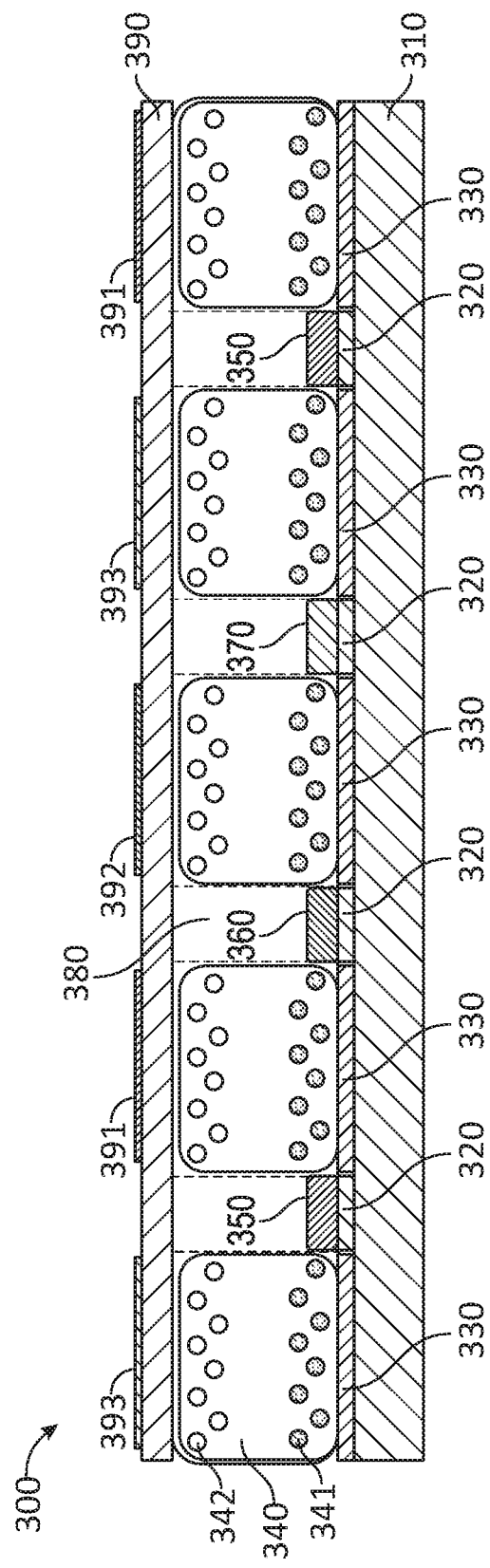
FIG. 3 depicts a cross-sectional side view of an embodiment of a display that includes an embodiment of EPD microcavities in accordance with one or more embodiments of the disclosure.

FIG. 3 depicts a cross-sectional side view of one embodiment of a display 300. The display 300 includes a substrate 310, and disposed on the substrate 310 are OLED electrodes 320 and electrodes 330. An EPD microcavity 340 is arranged on each of the EP driving pixel electrodes 330. Each EPD microcavity 340 includes a white pigment 342 and a black pigment 341. Disposed on the OLED electrodes 320 are a red OLED segment 350, a green OLED segment 360, and a blue OLED segment 370. The display 300 also includes a structural layer 380 that defines partitioning walls between the EPD microcavities 340. For example, the structural layer 380 may be formed of an optically clear material and may include microcavities separated by portioning walls, as illustrated by dashed lines. The microcavities may be formed in the structural layer 380, for example by molding, cast, removing material, or another material. The microcavities may be recessed portions formed in the structural layer 380. Opposing partitioning walls may form sidewalls of individual microcavities, thereby forming, at least partially, the microcavities. Disposed on the display at a side opposite the substrate is a color filter array substrate 390, and a color filter array that includes a red filter 391, a green filter 392, and a blue filter 393 is disposed on the color filter array substrate 290.

Figure 4A:
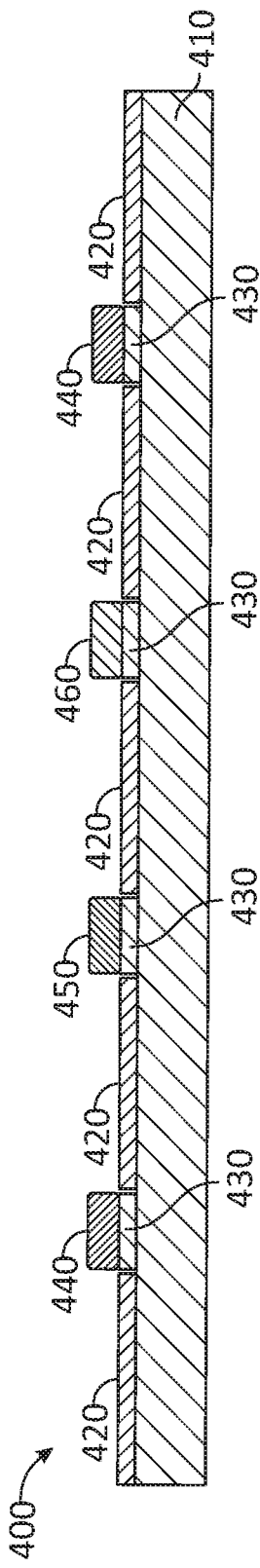
FIG. 4A depicts a cross-sectional side view of one embodiment of a substrate unit including an embodiment of an array of electrodes in accordance with one or more embodiments of the disclosure.

FIG. 4A-4D depict cross-sectional side views of the display depicted at FIG. 3 at various stages of assembly according to one embodiment of a method of manufacturing a display. As depicted at FIG. 4A, a substrate unit 400 is provided that includes a substrate 410 onto which an embodiment of an alternating array of electrodes has been disposed. The alternating array of electrodes includes a plurality of electrodes 420 and a plurality of OLED electrodes 430. Each of the plurality of electrodes 420 is arranged between two of the plurality of OLED electrodes 430. Other electrode array configurations are possible, however, and may be employed in the displays and methods provided herein. The substrate unit 400 also includes a plurality of OLED segments that includes red OLED segments 440, green OLED segments 450, and blue OLED segments 460. The plurality of OLED segments (440, 450, 460) is disposed on the plurality of OLED electrodes 430.

The substrate unit 400 of FIG. 4A generally may be assembled by any known techniques. The substrate unit 400 may provide an active matrix for controlling the pixels of a display.

Figure 4B:
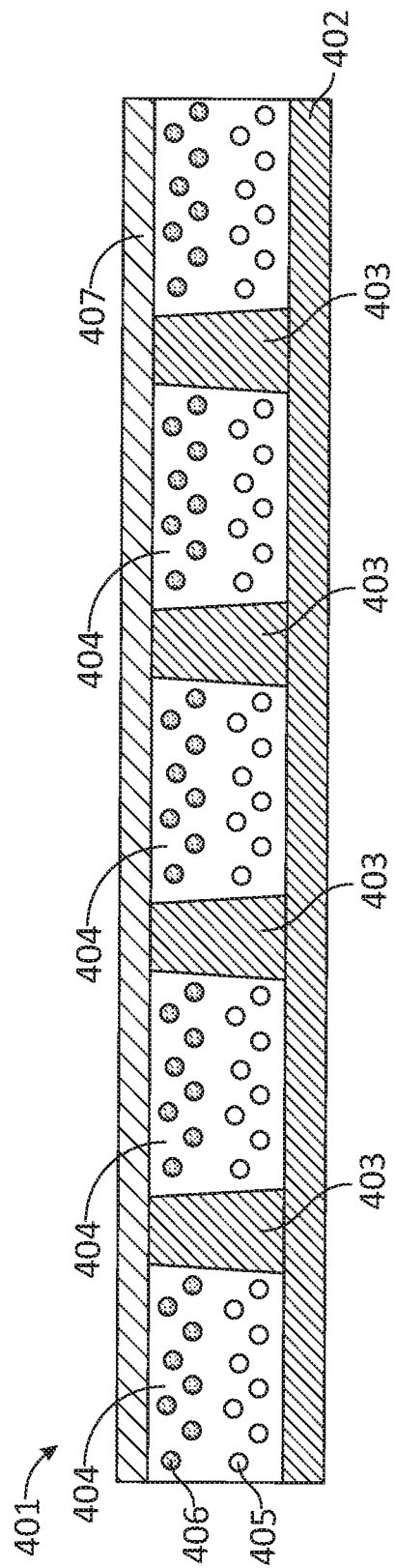
FIG. 4B depicts a cross-sectional side view of an embodiment of an EPD unit that includes a plurality of EPD microcavities in accordance with one or more embodiments of the disclosure.

FIG. 4B depicts an embodiment of an EPD unit 401. The EPD unit 401 includes an EPD unit substrate 402, which may include an indium tin oxide coated poly(ethylene terephthalate) substrate (ITO-PET). Extending from the EPD unit substrate 402 are partition walls 403. The partition walls 403 are formed from a transparent material, such as a polyacrylate, and define a plurality of EPD microcavities 404 in the EPD unit 401. The partition walls 403 may be formed by any known technique, including, but not limited to, micro-embossing. The partition walls 403 generally may have any dimensions that permit at least a portion of the light emitted by the OLED segments to escape the display. The partition walls, when viewed from the side and in cross-section (as at FIG. 4B), may be substantially square, rectangular, or trapezoidal. When the partition walls are trapezoidal, as depicted at FIG. 4B, the legs of the trapezoidal shape may border the EPD microcavities 404 and the smaller base may be arranged closer to the OLED segments (440, 450, 460), thereby providing a widening path for light emitted by the OLED segments (440, 450, 460) to escape the display.

The EPD microcavities 404 include a white pigment 405 and a black pigment 406, and are sealed by a sealant layer 407. The sealant layer 407 may be formed of any known material, such as 2-octylcyanoacrylate (OCA).

Figure 4C:
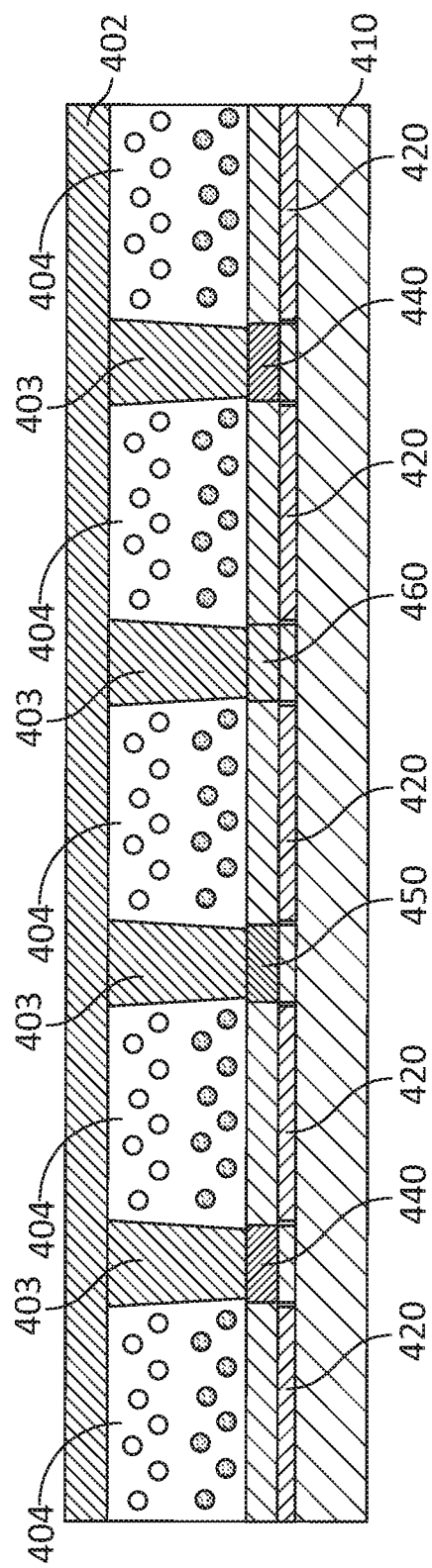
FIG. 4C depicts a cross-sectional side view of one embodiment of a substrate unit onto which an embodiment of an EPD unit has been arranged in accordance with one or more embodiments of the disclosure.

In the embodiment depicted at FIG. 4A-4D, the EPD unit 401 of FIG. 4B is disposed on the substrate unit 400 of FIG. 4A. As depicted at FIG. 4C, the EPD unit 401 is disposed on the substrate unit 400, and the EPD unit substrate 402 is arranged at the top of the display (e.g., opposite the substrate 410). The EPD unit 401 also is arranged on the substrate unit 400 in a manner that aligns (i) the partition walls 403 with the OLED segments (440, 450, 460), and (ii) the plurality of EPD microcavities 404 with the electrodes 420.

Figure 4D:
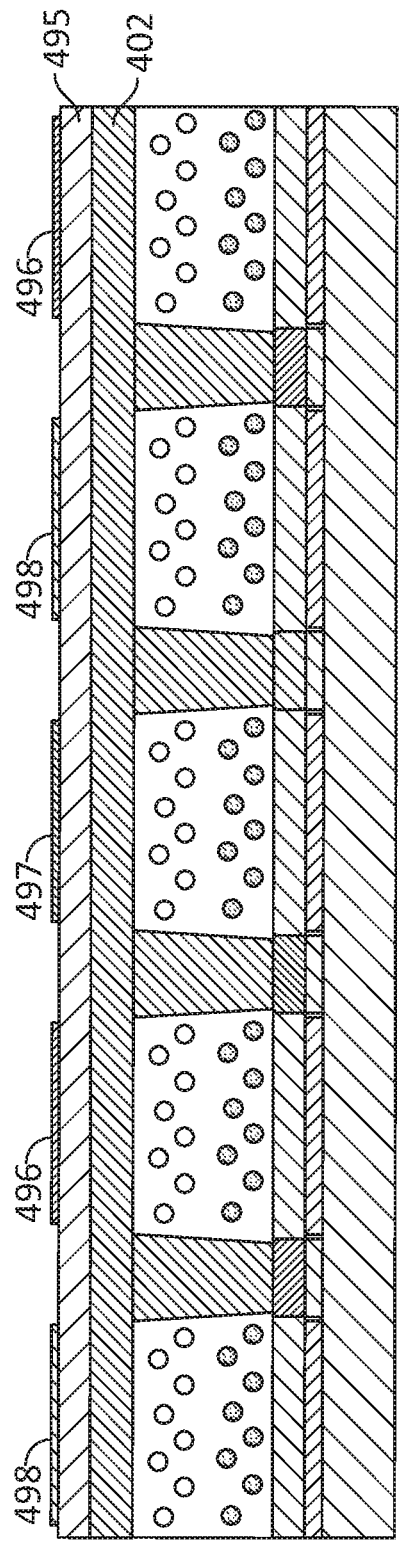
FIG. 4D depicts a cross-sectional side view of an embodiment of a display that includes an embodiment of EPD microcavities in accordance with one or more embodiments of the disclosure.

In the embodiment depicted at FIG. 4D, a color filter array substrate 495 is applied to the EPD unit substrate 402. The color filter array substrate 495 hosts a color filter array that includes red filters 496, green filters 497, and blue filters 498. The color filter array may be disposed on the color filter array substrate 495 before or after the color filter array substrate 495 is disposed on the EPD unit substrate 402.

The embodiment of the display depicted at FIG. 3 may be subjected to a driving scheme, in which the display assumes a white state, a black state, a red state, a green state, and a blue state, depending on the lighting conditions of the environment in which the display is used. Embodiments of these states are depicted at FIG. 5A-5E.

Figure 5A:
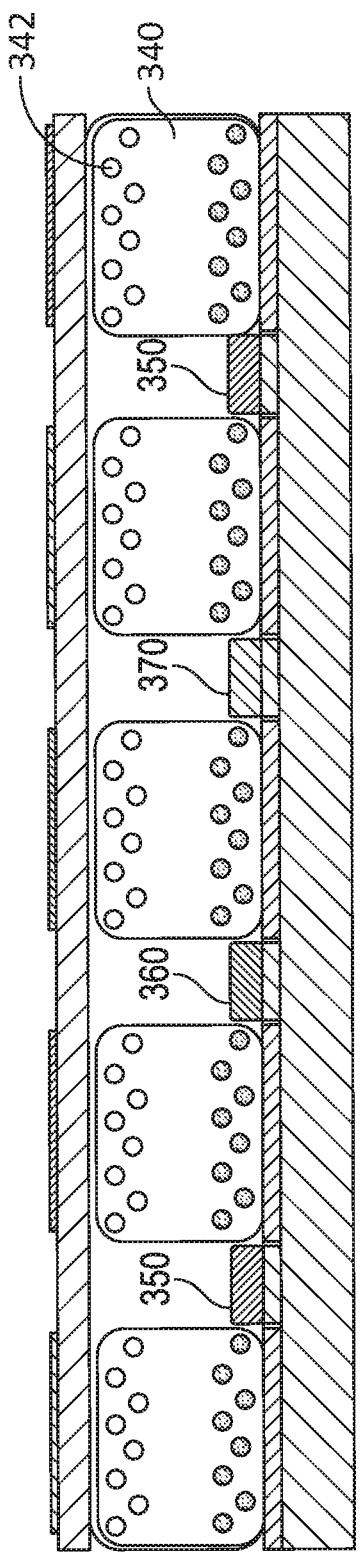
FIG. 5A depicts a cross-sectional side view of the device of FIG. 3 in a white state.

FIG. 5A depicts the device of FIG. 3 in a white state. The white state depicted at FIG. 5A is achieved by activating the white pigment 342 of the plurality of EPD microcavities 340, and emitting light from each of the red, green, and blue OLED segments (350, 360, 370).

As used herein, the phrase "activating the white (or black) pigment" refers to arranging the white (or black) pigment in the EPD microcavity or microcapsule so that it is visible to a user of the display.

Figure 5B:
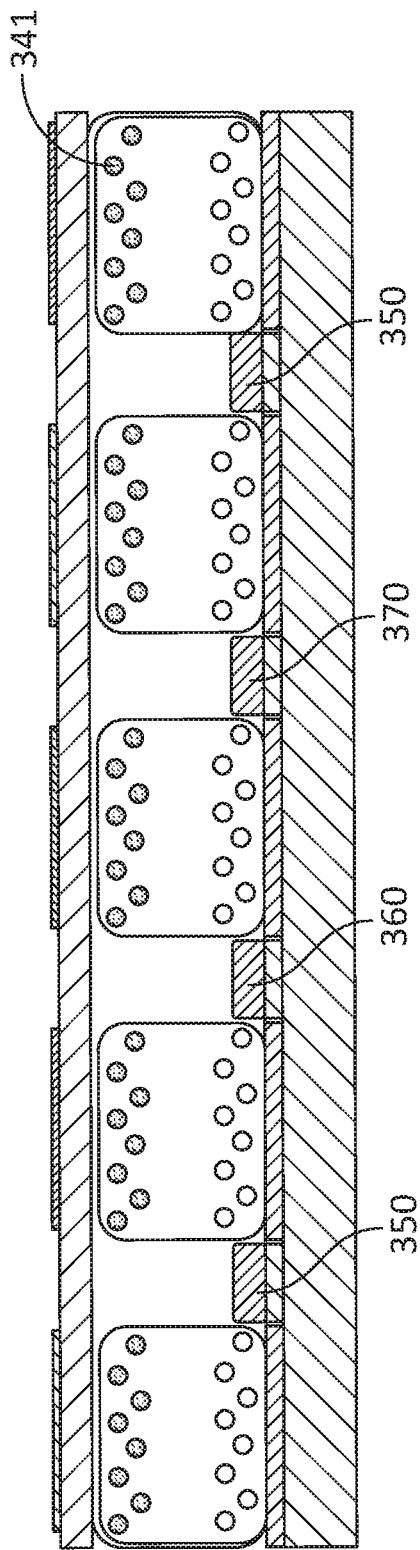
FIG. 5B depicts a cross-sectional side view of the device of FIG. 3 in a black state in accordance with one or more embodiments of the disclosure.

FIG. 5B depicts the device of FIG. 3 in a black state. The black state depicted at FIG. 5B is achieved by activating the black pigment 341 of the plurality of EPD microcavities 340, and not emitting light from the OLED segments (350, 360, 370).

Figure 5C:
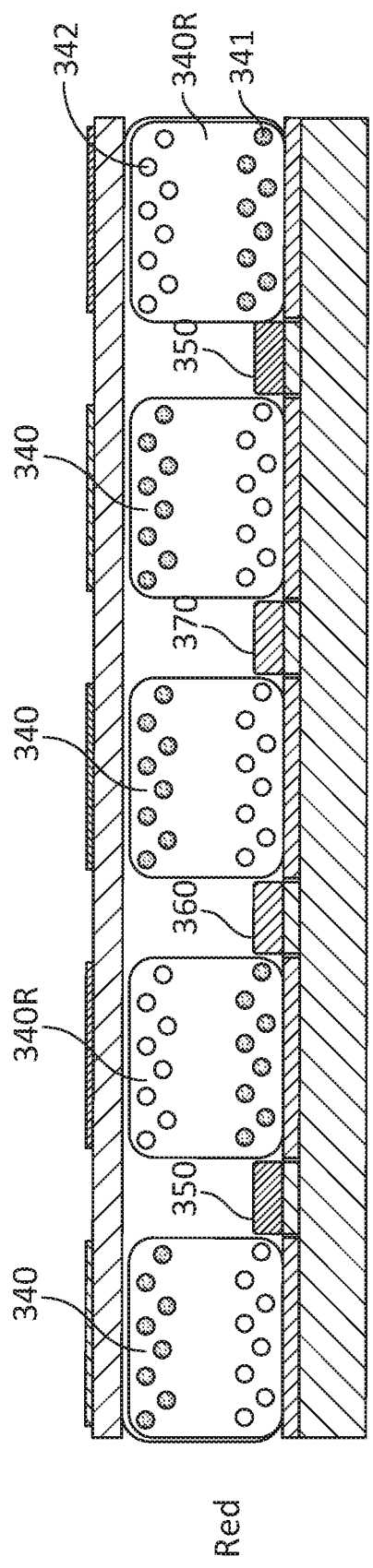
FIG. 5C depicts a cross-sectional side view of the device of FIG. 3 in a red state in accordance with one or more embodiments of the disclosure.

FIG. 5C depicts the device of FIG. 3 in a red state. The red state depicted at FIG. 5C is achieved by (i) activating the white pigment 342 of the EPD microcavities 340R that are adjacent to the red OLED segments 350, (ii) activating the black pigment 341 of the EPD microcavities 340 that are adjacent to the blue and green OLED segments (360, 370), (iii) emitting light from the red OLED segments 350, and (iv) not emitting light from the blue and green OLED segments (360, 370).

Figure 5D:
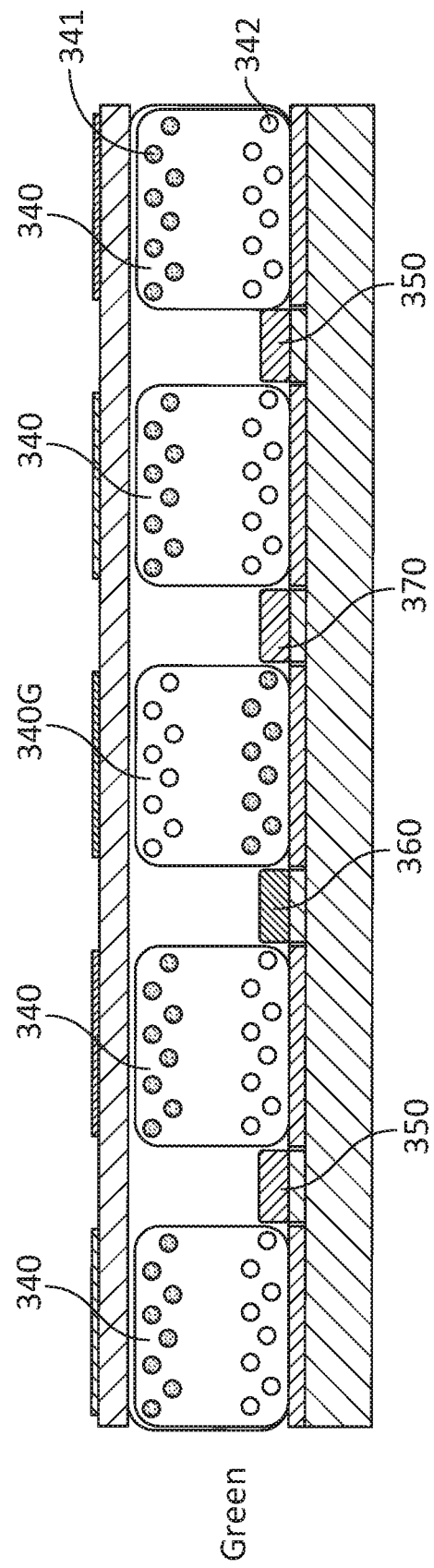
FIG. 5D depicts a cross-sectional side view of the device of FIG. 3 in a green state in accordance with one or more embodiments of the disclosure.

FIG. 5D depicts the device of FIG. 3 in a green state. The green state depicted at FIG. 5D is achieved by (i) activating the white pigment 342 of the EPD microcavities 340G that are adjacent to the green OLED segments 360, (ii) activating the black pigment 341 of the EPD microcavities 340 that are adjacent to the blue and red OLED segments (350, 370), (iii) emitting light from the green OLED segments 360, and (iv) not emitting light from the red and blue OLED segments (350, 370).

Figure 5E:
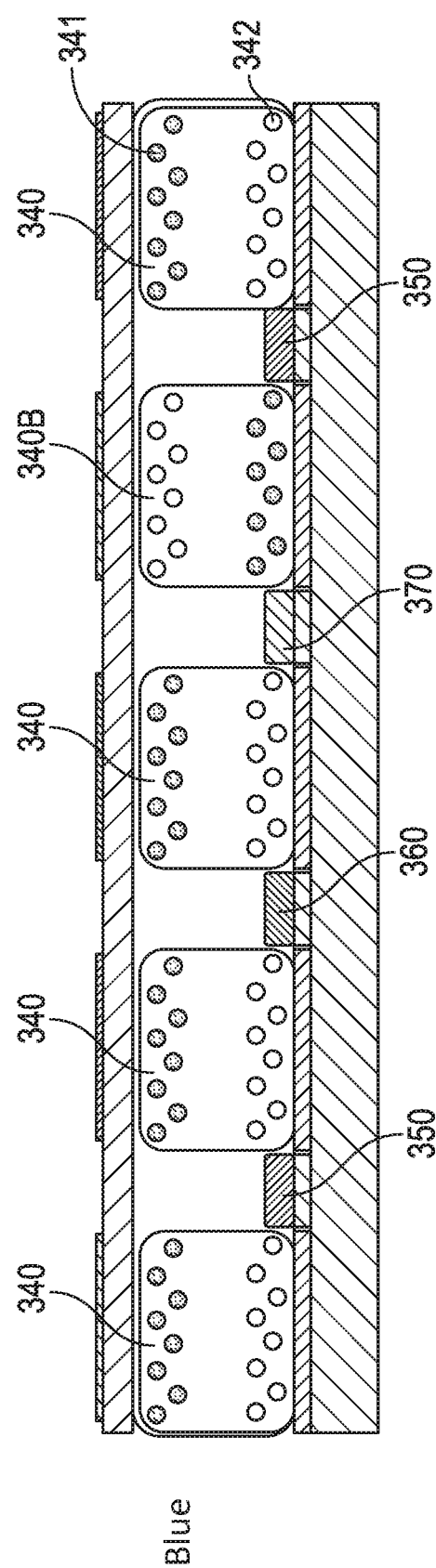
FIG. 5E depicts a cross-sectional side view of the device of FIG. 3 in a blue state in accordance with one or more embodiments of the disclosure.

FIG. 5E depicts the device of FIG. 3 in a blue state. The blue state depicted at FIG. 5E is achieved by (i) activating the white pigment 342 of the EPD microcavities 340B that are adjacent to the blue OLED segments 370, (ii) activating the black pigment 341 of the EPD microcavities 340 that are adjacent to the green and red OLED segments (350, 360), (iii) emitting light from the blue OLED segments 370, and (iv) not emitting light from the red and green OLED segments (350, 360).

In embodiments, the displays described herein include an alternating array including a plurality of OLED units and a plurality of EPD units disposed on a substrate; a structural layer defining walls separating each of the plurality of EPD units; a color filter array substrate disposed on the display at a side opposite the substrate; and a color filter array disposed on the color filter array substrate, wherein the plurality of OLED units comprises red OLED units, green OLED units, and blue OLED units, and the color filter array includes red filters, green filters, and blue filters that align the EPD segments that are adjacent to the red OLED units, the green OLED units, and the blue OLED units, respectively.

The substrate may have a first side and a second side, and, in one embodiment, the plurality of OLED units and the plurality of EPD units are disposed on the first side of the substrate. In another embodiment, the plurality of EPD units is disposed on the first side of the substrate, and the plurality of OLED units is disposed on the second side of the substrate. When the plurality of EPD units and the plurality of OLED units are disposed on different sides of the substrate, the substrate may be transparent.

As used herein, the phrase "alternating array" refers to an arrangement of at least two different units, wherein the first unit and the second unit are ordered in an alternating manner either individually, by group, or a combination thereof. For example, alternating arrays of OLED units ("O") and EPD units ("E") may include the following arrangements: [1] OEOEOEOE, [2] OEEOEEOEE, [3] EEOEEOEEO, [4] EEOOEEOO, etc.

In embodiments, the displays provided herein include a substrate; a red OLED unit; a first EPD unit; a green OLED unit; a second EPD unit; a blue OLED unit; a third EPD unit; a structural layer; a color filter array substrate; and a color filter array.

The substrate of the displays provided herein may be made from any known material, including, but not limited to, glass, plastic, semiconductor materials, ceramics, and circuit board materials. In one embodiment, the substrate is opaque. In another embodiment, the substrate is transparent.

The OLED units generally may include at least one electrode and one or more organic layers. OLED units may include reflectors, or a silver metal layer that reflects emitted light, and may optionally include a circular polarizer to reduce reflection. Such components may increase light efficiency and reduce reflection. The at least one electrode may include an "OLED electrode," as described herein. The one or more organic layers, which may include a light emitting layer, may be referred to herein as an "OLED segment." The OLED segment and the OLED electrode are components of an OLED unit. The OLED units may include one or more charge transport layers, one or more charge blocking layers, one or more injection layers, or a combination thereof. Each OLED unit may emit a color of light, such as red, blue, or green. Therefore, a red OLED unit, a blue OLED unit, and a green OLED unit are OLED units that emit red light, blue light, and green light, respectively.

The EPD units generally may include an electrode and at least two pigments of different color disposed in a microcapsule or a microcavity. The at least two pigments generally may be of any two different colors, such as black and white.

When the EPD units include microcavities, the EPD units may include a shared EPD substrate, and a shared sealant. The structural layer may be disposed between the EPD substrate and the sealant, and the structural layer may define walls separating a plurality of microcavities of the EPD unit. The structural layer may be disposed on the EPD substrate and/or the sealant using any known technique, including, but not limited to, micro-embossing. The plurality of microcavities, therefore, may be bounded by the structural layer, or the structural layer and at least one of the EPD substrate and the sealant. The EPD substrate may include any transparent material, including, but not limited to, IPO-PET. The sealant may include any compatible material, such as OCA.

When the EPD units include microcapsules, the EPD unit may include a structural layer in which the microcapsules are dispersed. As described herein, the microcapsules may be dispersed in a manner that substantially aligns the microcapsules with electrodes. The microcapsules generally may be of any size capable of accommodating the at least two pigments, and may be formed of a transparent material.

In embodiments, the red OLED unit, the blue OLED unit, the green OLED unit, the first EPD unit, the second EPD unit, and the third EPD unit, are arranged on the substrate. In one embodiment, the first EPD unit is arranged between the red OLED unit and the green OLED unit, the second EPD unit is arranged between the green OLED unit and the blue OLED unit, and the third EPD unit is arranged adjacent to the blue OLED unit on a side opposite the second EPD unit. The structural layer may define walls separating the first EPD unit, the second EPD unit, and the third EPD unit. The walls defined by the structural layer may align with the OLED units.

In embodiments, the color filter array substrate is disposed on a side of the display opposite the substrate. The color filter array substrate may be disposed on (i) the structural layer, (ii) the first, second, and third EPD units (or the plurality of EPD units), (iii) or a combination thereof. For example, when the EPD units include microcapsules, the color filter array substrate may be disposed on the structural layer in which the microcapsules are disposed. As used herein, the phrases "disposed on the first, second, and third EPD units" and "disposed on the plurality of EPD units" refer to the deposition on at least one part of [1] the first, second, and third EPD units or [2] the plurality of EPD units, including, but not limited to, an EPD substrate, which may be shared by the first, second, and third EPD units. The color filter array substrate may be disposed on the display using any known techniques, such as lamination.

A color filter array may be disposed on the color filter array substrate. The color filter array may be disposed on the color filter array substrate before or after the color filter array substrate is applied to the display. The color filter array may include a red filter, a blue filter, and a green filter. In embodiments, the red filter is disposed on a region of the color filter array substrate that corresponds to the first EPD unit, the green filter is disposed on a region of the color filter array substrate that corresponds to the second EPD unit, and the blue filter is disposed on a region of the color filter array substrate that corresponds to the third EPD. A region of the color filter array substrate "corresponds" with an EPD unit when, from a top view, the region overlaps the EPD unit completely or partially, and a filter is disposed on the region when the filter covers all or a portion of the region.

Devices also are provided that include one or more of the displays described herein. In embodiments, the device includes a smartphone, a tablet, an e-reader, a wearable device, a speaker device, a desktop computer, a laptop computer, a content streaming device, or a set-top box.

Methods of manufacturing displays also are provided herein. The methods provided herein may form displays that include EPD microcavities, EPD microcapsules, or a combination thereof.

In embodiments, the methods include providing a substrate onto which an alternating array of electrodes and a plurality of OLED segments are disposed, the alternating array of electrodes comprising a plurality of electrodes and a plurality of OLED electrodes, wherein the plurality of OLED segments are arranged on the plurality of OLED electrodes; disposing a first structural material on the plurality of electrodes; disposing a layer comprising hydrophobic segments and hydrophilic segments on the plurality OLED segments and the first structural material, wherein the hydrophobic segments are arranged on the plurality of OLED segments, and the hydrophilic segments are arranged on the first structural material; disposing on the layer comprising hydrophobic segments and hydrophilic segments a slurry comprising a second structural material and a plurality of EPD microcapsules, wherein the plurality of EPD microcapsules comprise one or more features effective to provide an attractive force between the plurality of EPD microcapsules and the hydrophilic segments; disposing a color filter array substrate on the second structural material. The methods also may include disposing a color filter array on the color filter array substrate. The color filter array may be disposed on the color filter array substrate before or after the color filter array substrate is disposed on the second structural material.

The one or more features effective to provide an attractive force between the plurality of EPD microcapsules and the hydrophilic segments may include, but are not limited to, one or more hydrophilic moieties in the chemical structure of the microcapsules. In embodiments, the methods include applying to the layer comprising the alternating series of hydrophobic segments and hydrophilic segments, the second structural material, or a combination thereof a voltage effective to facilitate or increase the alignment of the plurality of EPD microcapsules with the hydrophilic segments.

In embodiments, the second structural material is transparent. The second structural material may include a polyacrylate.

The disposing of the layer comprising hydrophobic segments and hydrophilic segments on the plurality OLED segments and the first structural material may be achieved by any known technique. In one embodiment, a dip coating lithography process is used to apply the layer.

In embodiments, the methods of manufacturing a display include providing a substrate onto which a plurality of OLED segments and an alternating array of electrodes are disposed, the alternating array of electrodes comprising a plurality of electrodes and a plurality of OLED electrodes, wherein the plurality of OLED segments are arranged on the plurality of OLED electrodes; providing an EPD apparatus comprising an EPD substrate, a transparent structural material, a sealant layer, and a plurality of EPD microcavities, wherein the transparent structural material defines walls separating the EPD microcavities, and the EPD microcavities comprise a black pigment and a white pigment; arranging the EPD apparatus onto the substrate, wherein the EPD microcavities are substantially aligned with the plurality of electrodes, and the walls defined by the transparent structural material are substantially aligned with the plurality of OLED segments; and disposing a color filter array substrate on the EPD apparatus. The methods also may include disposing a color filter array on the color filter array substrate. The color filter array may be disposed on the color filter array substrate prior to the disposing of the color filter array substrate on the EPD apparatus.

FIG. 6 illustrates example pixel designs 600 in top view in accordance with one or more embodiments of the disclosure. The pixel designs 600 may include a first pixel design 610 with a number of EPD segments 612 separated by individual LED segments. For example, a red LED segment 620 may be positioned in between two EPD segments 612, a green LED segment 630 may be positioned in between two EPD segments 612, and a blue LED segment 640 may be positioned adjacent to, or in between, one or more EPD segments 612. The green LED segment 630 may be positioned between the red LED segment 620 and the blue LED segment 640. The first pixel design 610 illustrates a first example type of LED segment.

A second pixel design 650 illustrates a second example type of LED segment, where red, green, and blue LEDs are positioned adjacent to each other in a group, and where the group is positioned adjacent to an EPD segment. The pixel may include a number of subpixels 652, each with the arrangement of an EPD segment having length and width dimensions, and a group of red, green, and blue LEDs having a group length and group width equal to or substantially equal to the length and width of the EPD segment. The second pixel design 650 may include, for example, four subpixels 652.

A third pixel design 660 illustrates a third example type of LED segment, where the blue LED portion has greater dimensions than the red and green LED portions. In the third pixel design 660, a subpixel 662 may include an EPD segment having a length and width, and a blue LED portion having the same length as the EPD segment. The red and green LED portions may be positioned adjacent to the blue LED portion but may have substantially half the length of the blue LED portion. As a result, the blue LED portion may have a rectangular geometry, while the red and green LED portions may have square geometries. The red and green LED portions may have greater widths than the blue LED portion. The combined length and width of the LED segment may be substantially equal to the length and width of the EPD segment.

A fourth pixel design 670 may include a subpixel 672 with relatively larger EPD segments than the other pixel designs, and the LED segment may include the LED segment of the third pixel designed, with the blue LED portion having a different geometry than the red and green LED portions. In the fourth pixel design 670, the LED segment may be positioned on top of, or in a cutout portion of the EPD segment such that the LED segment is adjacent to more than one edge surface of the EPD segment. In the illustrated embodiment, the LED segment may be positioned near a corner of the EPD segment. The LED segment may be positioned on top of the EPD segment, or may be positioned in a rectangular cutout portion of the EPD segment, such as in the example of FIG. 6.

One or more operations of the methods, process flows, or use cases of FIGS. 1-6 may have been described above as being performed by a user device, or more specifically, by one or more program module(s), applications, or the like executing on a device. It should be appreciated, however, that any of the operations of the methods, process flows, or use cases of FIGS. 1-6 may be performed, at least in part, in a distributed manner by one or more other devices, or more specifically, by one or more program module(s), applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-6 may be described in the context of the illustrative devices, it should be appreciated that such operations may be implemented in connection with numerous other device configurations.

The operations described and depicted in the illustrative methods, process flows, and use cases of FIGS. 1-6 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-6 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 7:
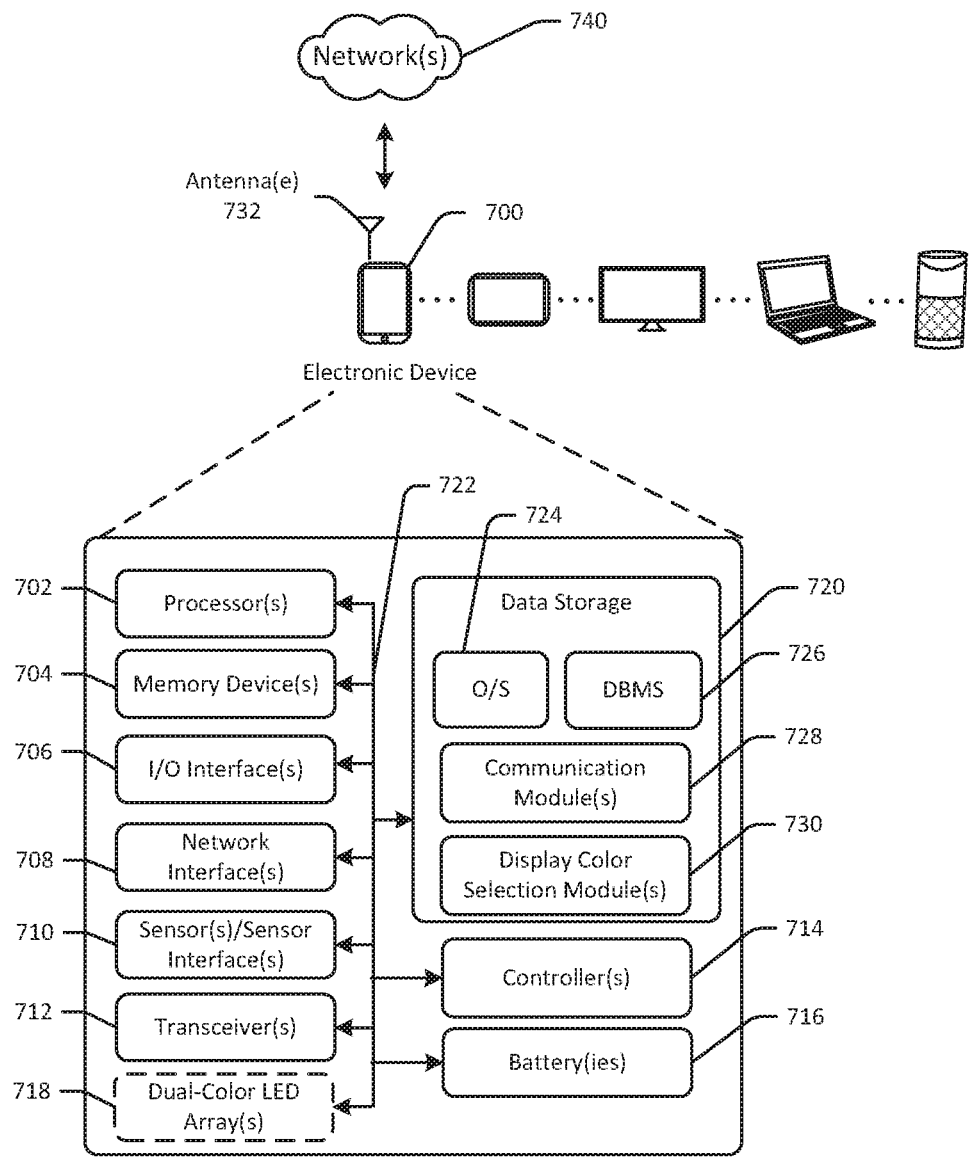
FIG. 7 schematically illustrates an example architecture of an electronic device in accordance with one or more embodiments of the disclosure.

FIG. 7 is a schematic block diagram of one or more illustrative electronic device(s) 700 in accordance with one or more example embodiments of the disclosure. The electronic device(s) 700 may include any suitable computing device including, but not limited to, a server system, a camera or camera system, a mobile device such as a smartphone, a tablet, an e-reader, a wearable device, a speaker device, or the like; a desktop computer; a laptop computer; a content streaming device; a set-top box; or the like. The electronic device(s) 700 may correspond to an illustrative device configuration for the electronic device(s) of FIGS. 1-6.

The electronic device(s) 700 may be configured to communicate via one or more networks with one or more servers, user devices, or the like. The electronic device(s) 700 may have a battery that is configured to prevent swelling or other damage, which may prevent damage to the electronic device(s) 700. The electronic device(s) 700 may be configured to select one or more wireless communication protocols, and control operations of remote devices, such an internet of things devices, and other operations.

The electronic device(s) 700 may be configured to communicate via one or more networks 740. Such network(s) 740 may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) 740 may have any suitable communication range associated therewith and may include, for example, global networks (e.g., the Internet), metropolitan area networks (MANs), wide area networks (WANs), local area networks (LANs), or personal area networks (PANs). In addition, such network(s) 740 may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 700 may include one or more processors (processor(s)) 702, one or more memory devices 704 (generically referred to in this section as memory 704), one or more input/output (I/O) interfaces 706, one or more network interfaces 708, one or more sensors or sensor interfaces 710, one or more transceivers 712, one or more controllers 714, one or more batteries 716, one or more optional dual-color LED array(s) 718, and data storage 720. The electronic device(s) 700 may further include one or more buses 722 that functionally couple various components of the electronic device(s) 700. The electronic device(s) 700 may optionally include one or more antenna(e) 732 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, an RFID antenna, and so forth.

The bus(es) 722 may include at least one of a system bus, a memory bus, an address bus, or a message bus, and may permit the exchange of information (e.g., data (including computer-executable code), signaling, etc.) between various components of the electronic device(s) 700. The bus(es) 722 may include, without limitation, a memory bus or a memory controller, a peripheral bus, an accelerated graphics port, and so forth. The bus(es) 722 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 704 of the electronic device(s) 700 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 704 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 704 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 720 may include removable storage and/or non-removable storage including, but not limited to, magnetic storage, optical disk storage, and/or tape storage. The data storage 720 may provide non-volatile storage of computer-executable instructions and other data. The memory 704 and the data storage 720, removable and/or non-removable, are examples of computer-readable storage media (CRSM) as that term is used herein.

The data storage 720 may store computer-executable code, instructions, or the like that may be loadable into the memory 704 and executable by the processor(s) 702 to cause the processor(s) 702 to perform or initiate various operations. The data storage 720 may additionally store data that may be copied to the memory 704 for use by the processor(s) 702 during the execution of the computer-executable instructions. Moreover, output data generated as a result of execution of the computer-executable instructions by the processor(s) 702 may be stored initially in the memory 704, and may ultimately be copied to the data storage 720 for non-volatile storage.

More specifically, the data storage 720 may store one or more operating systems (O/S) 724; one or more database management systems (DBMS) 726; and one or more program module(s), applications, engines, computer-executable code, scripts, or the like such as, for example, one or more communication module(s) 728 and/or one or more display color selection module(s) 730. Some or all of these module(s) may be or include sub-module(s). Any of the components depicted as being stored in data storage 720 may include any combination of software, firmware, and/or hardware. The software and/or firmware may include computer-executable code, instructions, or the like that may be loaded into the memory 704 for execution by one or more of the processor(s) 702. Any of the components depicted as being stored in data storage 720 may support the functionality described in reference to the corresponding components named earlier in this disclosure.

The data storage 720 may further store various types of data utilized by the components of the electronic device(s) 700. Any data stored in the data storage 720 may be loaded into the memory 704 for use by the processor(s) 702 in executing computer-executable code. In addition, any data depicted as being stored in the data storage 720 may potentially be stored in one or more datastore(s) and may be accessed via the DBMS 726 and loaded in the memory 704 for use by the processor(s) 702 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 7, an example datastore(s) may include, for example, user account or user profile data, user device or battery settings, user device preferences and authorizations, and other information.

The processor(s) 702 may be configured to access the memory 704 and execute the computer-executable instructions loaded therein. For example, the processor(s) 702 may be configured to execute computer-executable instructions of the various program module(s), applications, engines, or the like of the electronic device(s) 700 to cause or facilitate various operations to be performed in accordance with one or more embodiments of the disclosure. The processor(s) 702 may include any suitable processing unit capable of accepting data as input, processing the input data in accordance with stored computer-executable instructions, and generating output data. The processor(s) 702 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), an Image Signal Processor (ISP), a digital signal processor (DSP), and so forth. Further, the processor(s) 702 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 702 may be capable of supporting any of a variety of instruction sets.

Referring now to functionality supported by the various program module(s) depicted in FIG. 7, the communication module(s) 728 may include computer-executable instructions, code, or the like that responsive to execution by one or more of the processor(s) 702 may perform functions including, but not limited to, communicating with remote servers or devices, communicating with remote datastores, communicating with local servers or devices on an intranet, sending or receiving information and instructions, sending or receiving orders, and the like.

The display color selection module(s) 730 may include computer-executable instructions, code, or the like that responsive to execution by one or more of the processor(s) 702 may perform functions including, but not limited to, determining an LED color to activate, determining one or more LED colors to use, controlling operation of one or more LEDs or LED arrays, controlling display components or driving circuits, and the like.

Referring now to other illustrative components depicted as being stored in the data storage 720, the 0/S 724 may be loaded from the data storage 720 into the memory 704 and may provide an interface between other application software executing on the electronic device(s) 700 and the hardware resources of the electronic device(s) 700. More specifically, the 0/S 724 may include a set of computer-executable instructions for managing the hardware resources of the electronic device(s) 700 and for providing common services to other application programs (e.g., managing memory allocation among various application programs). In certain example embodiments, the 0/S 724 may control execution of the other program module(s) to dynamically enhance characters for content rendering. The O/S 724 may include any operating system now known or which may be developed in the future including, but not limited to, any server operating system, any mainframe operating system, or any other proprietary or non-proprietary operating system.

The DBMS 726 may be loaded into the memory 704 and may support functionality for accessing, retrieving, storing, and/or manipulating data stored in the memory 704 and/or data stored in the data storage 720. The DBMS 726 may use any of a variety of database models (e.g., relational model, object model, etc.) and may support any of a variety of query languages. The DBMS 726 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 700 is a mobile device, the DBMS 726 may be any suitable light-weight DBMS optimized for performance on a mobile device.

Referring now to other illustrative components of the electronic device(s) 700, the input/output (I/O) interface(s) 706 may facilitate the receipt of input information by the electronic device(s) 700 from one or more I/O devices as well as the output of information from the electronic device(s) 700 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 700 or may be separate. The I/O devices may further include, for example, any number of peripheral devices such as data storage devices, printing devices, and so forth.

The I/O interface(s) 706 may also include an interface for an external peripheral device connection such as universal serial bus (USB), micro-USB, FireWire, Thunderbolt, Ethernet port or other connection protocol that may connect to one or more networks. The I/O interface(s) 706 may also include a connection to one or more of the antenna(e) 732 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, a WiMAX network, a 3G network, a ZigBee network, etc.

The electronic device(s) 700 may further include one or more network interface(s) 708 via which the electronic device(s) 700 may communicate with any of a variety of other systems, platforms, networks, devices, and so forth. The network interface(s) 708 may enable communication, for example, with one or more wireless routers, one or more host servers, one or more web servers, and the like via one or more networks.

The optional antenna(e) 732 may include any suitable type of antenna depending, for example, on the communications protocols used to transmit or receive signals via the antenna(e) 732. Non-limiting examples of suitable antennae may include directional antennae, non-directional antennae, dipole antennae, folded dipole antennae, patch antennae, multiple-input multiple-output (MIMO) antennae, or the like. The antenna(e) 732 may be communicatively coupled to one or more transceivers 712 or radio components to which or from which signals may be transmitted or received.

As previously described, the antenna(e) 732 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 732 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 732 may be configured to transmit or receive radio frequency signals within any suitable frequency range forming part of the unlicensed portion of the radio spectrum.

The antenna(e) 732 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 712 may include any suitable radio component(s) for—in cooperation with the antenna(e) 732—transmitting or receiving radio frequency (RF) signals in the bandwidth and/or channels corresponding to the communications protocols utilized by the electronic device(s) 700 to communicate with other devices. The transceiver(s) 712 may include hardware, software, and/or firmware for modulating, transmitting, or receiving—potentially in cooperation with any of antenna(e) 732—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 712 may further include hardware, firmware, or software for receiving GNSS signals. The transceiver(s) 712 may include any known receiver and baseband suitable for communicating via the communications protocols utilized by the electronic device(s) 700. The transceiver(s) 712 may further include a low noise amplifier (LNA), additional power signal amplifiers (PA), an analog-to-digital (A/D) converter, one or more buffers, a digital baseband, or the like.

The controller(s) 714 may be any microcontroller or microprocessor configured to control one or more operations of the electronic device(s) 700. The battery(ies) 716 may be a swelling resistant pouch battery configured to power the electronic device(s) 700. For example, the battery 716 may be a lithium-ion battery. The battery 716 may be coupled to the one or more optional dual-color LED array(s) 718. The one or more optional dual-color LED array(s) 718 may include one or more LED colors, such as amber colored LEDs, cool white LEDs, and other LED colors, and may include LEDs having a specific arrangement, such as an alternating arrangement, a separated arrangement, or another arrangement.

The sensor(s)/sensor interface(s) 710 may include or may be capable of interfacing with any suitable type of sensing device such as, for example, inertial sensors, force sensors, thermal sensors, and so forth. Example types of inertial sensors may include accelerometers (e.g., MEMS-based accelerometers), gyroscopes, and so forth.

It should be appreciated that the program module(s), applications, computer-executable instructions, code, or the like depicted in FIG. 7 as being stored in the data storage 720 are merely illustrative and not exhaustive and that the processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 700, and/or hosted on other computing device(s) accessible via one or more networks, may be provided to support the functionality provided by the program module(s), applications, or computer-executable code depicted in FIG. 7 and/or additional or alternate functionality. Further, functionality may be modularized differently such that processing described as being supported collectively by the collection of program module(s) depicted in FIG. 7 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 7 may be implemented, at least partially, in hardware and/or firmware across any number of devices.

It should further be appreciated that the electronic device(s) 700 may include alternate and/or additional hardware, software, or firmware components beyond those described or depicted without departing from the scope of the disclosure. More particularly, it should be appreciated that software, firmware, or hardware components depicted as forming part of the electronic device(s) 700 are merely illustrative and that some components may not be present or additional components may be provided in various embodiments. While various illustrative program module(s) have been depicted and described as software module(s) stored in the data storage 720, it should be appreciated that the functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, schematics, and use cases of FIGS. 1-6 may be performed by a device having the illustrative configuration depicted in FIG. 7, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-6 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-6 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in any applicable flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in any flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A device display comprising:
    a substrate;
    a first electrophoretic display (EPD) unit disposed on the substrate;
    a first red organic light emitting diode (OLED) unit disposed on the substrate adjacent to the first EPD unit;
    a second EPD unit disposed on the substrate adjacent to the red OLED unit;
    a first green OLED unit disposed on the substrate adjacent to the red OLED unit;
    a third EPD unit disposed on the substrate adjacent to the green OLED unit;
    a first blue OLED unit disposed on the substrate adjacent to the green OLED unit;
    a structural layer that defines walls separating the first EPD unit, the second EPD unit, and the third EPD unit;
    a second red OLED unit disposed on the substrate adjacent to the first red OLED unit and the third EPD unit;
    a second green OLED unit disposed on the substrate adjacent to the second red OLED unit and the first green OLED unit;
    a second blue OLED unit disposed on the substrate adjacent to the second green OLED unit and the first blue OLED unit;
    a color filter array substrate disposed on a side of the display opposite the substrate; and
    a color filter array disposed on the color filter array substrate;
    wherein the first and the second EPD units and the red, the green, and the blue OLED units together form a single pixel of the display.

2. The device display of claim 1, wherein each of the first and the second EPD units has a first length and a first width, and wherein each of the first red, the first green, and the first blue OLED units has the first length and a second width that is less than the first width.

3. The device display of claim 1, wherein the structural layer at least partially forms a plurality of microcavities, and wherein a black pigment and a white pigment are disposed in the microcavities to form the respective first and second EPD units.

4. The device display of claim 1, wherein the color filter array comprises a red filter, a blue filter, and a green filter; and
    wherein the red filter is disposed on a region of the color filter array substrate that corresponds to the first EPD unit, the green filter is disposed on a region of the color filter array substrate that corresponds to the second EPD unit, and the blue filter is disposed on a region of the color filter array substrate that corresponds to the third EPD unit.

5. A display comprising:
    a substrate;
    a plurality of electrophoretic display (EPD) units disposed on the substrate;
    a plurality of organic light emitting diode (OLED) units disposed on the substrate, the plurality of OLED units comprising a first red OLED unit, a first green OLED unit, and a first blue OLED unit, wherein the plurality of EPD units and the plurality of OLED units are arranged in at least one layer on the substrate;
    a hydrophobic material layer disposed on the plurality of OLED units; and
    a structural layer defining walls separating each of the plurality of EPD units.

6. The display of claim 5, wherein the plurality of EPD units comprises a first EPD unit a second EPD unit, and a third EPD unit, and wherein the first red OLED unit is positioned between the first EPD unit and the second EPD unit, the first green OLED unit is positioned between the second EPD unit and the third EPD unit, and the first blue OLED unit is positioned adjacent to the third EPD unit.

7. The display of claim 5, wherein the plurality of EPD units comprises a first EPD unit and a second EPD unit;
    wherein the first red OLED unit is positioned adjacent to the first EPD unit, the first green OLED unit is positioned adjacent to the first red OLED unit, and the first blue OLED unit is positioned adjacent to the first green OLED unit; and wherein the second EPD unit is positioned adjacent to the first blue OLED unit.

8. The display of claim 7, wherein the plurality of EPD units further comprises a third EPD unit positioned adjacent to the first EPD unit, and wherein the plurality of OLED units comprises a second red OLED unit, a second green OLED unit, and a second blue OLED unit; wherein the second red OLED unit is positioned adjacent to the first red OLED unit and the third EPD unit, the second green OLED unit is positioned adjacent to the second red OLED unit and the first green OLED unit, and the second blue OLED unit is positioned adjacent to the second green OLED unit and the first blue OLED unit.

9. The display of claim 5, wherein the plurality of EPD units comprises a first EPD unit and a second EPD unit; and wherein the first blue OLED unit is positioned adjacent to the first EPD unit, the first red OLED unit is positioned adjacent to the first blue OLED unit and the first green OLED unit, the first green OLED unit is positioned adjacent to the first blue OLED unit and the first red OLED unit, and the second EPD unit is positioned adjacent to the first red OLED unit and the first green OLED unit.

10. The display of claim 5, further comprising:

a color filter array substrate disposed on a side of the display opposite the substrate; and a color filter array disposed on the color filter array substrate, the color filter array comprising a red filter, a blue filter, and a green filter;

wherein the red filter aligns with the EPD unit adjacent to the first red OLED unit, the blue filter aligns with the EPD unit adjacent to the first green OLED unit, and the green filter aligns with the EPD unit adjacent to the first blue OLED unit.

11. The display of claim 5, wherein the structural layer comprises a plurality of microcavities formed in the structural layer, wherein sidewalls of individual microcavities are formed by the structural layer, and wherein a black pigment and a white pigment are disposed in the microcavities to form the plurality of EPD units.

12. The display of claim 5, wherein the plurality of EPD units are disposed on a first side of the substrate, and the plurality of OLED units are disposed on a second side of the substrate.

13. The display of claim 5, wherein the plurality of OLED units are positioned adjacent to more than one edge surface of a first EPD unit of the plurality of EPD units.

14. A display comprising:

a substrate;

a structural material disposed on the substrate;

a first organic light emitting diode (OLED) segment disposed on the substrate, the first OLED segment comprising a red OLED, a green OLED, and a blue OLED;

a hydrophobic material layer disposed on the first OLED segment;

a hydrophilic material layer disposed on the structural material; and a first electrophoretic display (EPD) segment disposed on the hydrophilic material layer.

15. The display of claim 14, wherein the first OLED segment and the first EPD segment are arranged in a single layer.

16. The display of claim 14, further comprising a first EPD microcapsule disposed on the hydrophilic material layer, wherein the first EPD microcapsule comprises a material attracted to the hydrophilic material layer.

17. The display of claim 16, further comprising a second EPD microcapsule that is positioned on a side of the first OLED segment opposite the first EPD microcapsule.

18. The display of claim 14, further comprising a color filter array substrate and a color filter array disposed on the color filter array substrate.

19. The display of claim 15, wherein the structural material comprises an optically clear polyacrylate material.

20. The display of claim 5, further comprising:

a hydrophilic material layer disposed on the structural layer.

* * * * *